(12) United States Patent
Seijger et al.

(10) Patent No.: US 8,773,640 B2
(45) Date of Patent: Jul. 8, 2014

(54) INSPECTION METHOD AND APPARATUS

(75) Inventors: Olav Johannes Seijger, Eindhoven (NL); Martinus Joseph Kok, Eindhoven (NL); Sander Kerssemakers, Eindhoven (NL); Mark Johannes Magielsen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 783 days.

(21) Appl. No.: 12/993,463

(22) PCT Filed: May 25, 2009

(86) PCT No.: PCT/EP2009/056300
§ 371 (c)(1),
(2), (4) Date: Apr. 4, 2011

(87) PCT Pub. No.: WO2009/150031
PCT Pub. Date: Dec. 17, 2009

(65) Prior Publication Data
US 2011/0176123 A1    Jul. 21, 2011

Related U.S. Application Data

(60) Provisional application No. 61/071,983, filed on May 29, 2008.

(51) Int. Cl.
*G03B 27/58* (2006.01)
*G03B 27/42* (2006.01)

(52) U.S. Cl.
USPC .............................. 355/72; 355/53

(58) Field of Classification Search
USPC ................ 355/53, 72; 356/603; 250/442.11; 118/718
See application file for complete search history.

(56) References Cited

U.S. PATENT DOCUMENTS 7,502,103 B2    3/2009  Plug et al.
(Continued)

FOREIGN PATENT DOCUMENTS

EP    1 628 164 A2    2/2006
EP    1 862 856 A1    12/2007

OTHER PUBLICATIONS

International Preliminary Report on Patentability with Written Opinion of the International Searching Authority directed to related International Application No. PCT/EP2009/056300, mailed on Dec. 9, 2010, The International Bureau of WIPO, Geneva, Switzerland; 10 pages.

(Continued)

*Primary Examiner* — Peter B Kim
(74) *Attorney, Agent, or Firm* — Sterne, Kessler, Goldstein & Fox P.L.L.C (57) ABSTRACT

An inspection apparatus for measuring a property of a substrate (W), includes a base frame, a substrate table (51) to hold the substrate, an illumination system arranged to direct a beam of radiation onto the substrate and a sensor arranged to detect radiation reflected off the substrate. Two balanced positioning systems displace the substrate table and sensor relative to the base frame in several directions. Each balanced positioning system includes a balance mass (59, 61), a bearing arrangement (65) to movably support the balance mass and tracks effective to guide the displacement in each direction. A motor arrangement causes the displacement in each direction. The balance mass is positioned relative to the track arrangement such that the centers of gravity of each balance mass and the substrate table or the sensor are substantially aligned in the direction substantially perpendicular to the plane including the direction of displacement.

14 Claims, 7 Drawing Sheets

(56) References Cited

U.S. PATENT DOCUMENTS

2006/0017908 A1\*  1/2006  Mayama .................. 355/72
2008/0018874 A1\*  1/2008  Dusa et al. ............... 355/55
2008/0084122 A1   4/2008  Koide
2008/0088832 A1   4/2008  Cramer et al.

OTHER PUBLICATIONS

International Search Report directed to related International Patent Application No. PCT/EP2009/056300, mailed Sep. 30, 2009; 3 pages.

\* cited by examiner

INSPECTION METHOD AND APPARATUS

CROSS-REFERENCE TO RELATED APPLICATIONS

This application claims the benefit of U.S. provisional application 61/071,983, which was filed on May 29, 2008, and which is incorporated herein in its entirety by reference.

FIELD

The present invention relates to balanced positioning systems, such as may be used to position a movable object in at least three degrees of freedom. The invention has particular relevance to the use of such a balance positioning system in a lithographic system including a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is desirable to measure parameters of the patterned substrate, for example the overlay error between successive layers formed in or on it. There are various techniques for making measurements of the microscopic structures formed in lithographic processes, including the use of scanning electron microscopes and various specialized metrology tools. One form of specialized metrology tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

A metrology tool such a scatterometer typically includes a base frame and a substrate stage constructed to carry a substrate movably connected in the "Z" direction with respect to the base frame, using a first displacement system. The substrate stage is typically also provided with a second displacement system configured to rotate the substrate table in the X-Y plane with respect to the substrate stage. Above the substrate stage along the Z direction, there is provided a sensor stage arranged to detect radiation scattered from the substrate, the sensor stage being movably connected to the base frame by means of a third displacement system. Each displacement system may be fixed to the surrounding frame. However this may introduce vibrations in the frame, which may limit performance and/or throughput. In order to minimize this, it is known to provide at each stage, that is the substrate stage and the sensor stage, a balance mass designed to avoid acceleration forces from being applied to the frame.

EP 1 862 856 discloses a metrology tool arranged to measure a parameter of the substrate, that has been provided with a pattern by a lithographic apparatus. The metrology tool includes a base frame, a substrate table constructed and arranged to hold a substrate, and a sensor arranged to measure a parameter of the substrate. A displacement system is provided to displace one of the substrate table and the sensor with respect to the other in at least one direction. A balance mass is provided, a first bearing movably supporting the balance mass so as to be substantially free to translate in the opposite direction to the displacement of the substrate table or the sensor. The substrate stage in the balance mass may form part of an integrated linear motor, in which the wafer stage is provided with a stage carrying coils acting as a rotor, while the balance mass is formed as a plate acting as an armature, both armature and stator being guided with respect to the base frame. The balance mass is provided at a position displaced horizontally with respect to the base frame, bearing directly onto the base frame. Such an arrangement may however, in a metrology tool in which is space is very limited, increase the footprint of the machine in order to accommodate the balance mass.

SUMMARY

It is desirable to provide an inspection apparatus including a balanced positioning system.

According to an aspect of the invention, there is provided an inspection apparatus, lithographic apparatus or lithographic cell configured to measure a property of a substrate.

According to an aspect of the present invention there is provided an inspection apparatus configured to measure a property of a substrate, including a base frame; a substrate table configured to support the substrate; an illumination system arranged to direct a beam of radiation onto the substrate; at least one sensor arrangement constructed and arranged to detect radiation reflected off the substrate; and a balanced positioner system configured to displace one of the substrate table and sensor arrangement in at least one direction, the balanced positioning system including: at least one balance mass; a bearing arrangement configured to movably support the balance mass; a track arrangement effective to guide the displacement in the one direction; and a motor arrangement effective to cause the displacement in the one direction; wherein the balance mass is positioned relative to the track arrangement such that the centers of gravity of the balance mass and the one of the substrate table and sensor arrangement are substantially aligned.

According to an aspect of the present invention there is provided a method of measuring a property of a substrate, including supporting the substrate on a substrate table; directing a beam of radiation onto the substrate; using at least one sensor arrangement to detect radiation reflected off the substrate; and using a balanced positioning system to displace one of the substrate table and sensor arrangement in at least one direction, the balanced positioning system including: a balance mass; a bearing configured to movably support the balance mass; a track arrangement effective to guide the displacement in the one direction; and a motor arrangement configured to cause the displacement in the one direction; wherein the balance mass is positioned relative to the track arrangement such that the centers of gravity of the balance mass and the one of the substrate table and sensor arrangement are substantially aligned in the direction substantially perpendicular to the plane including the direction of displacement.

According to an aspect of the present invention there is provided a lithographic system including: a lithographic apparatus, including: an illumination system configured to condition a radiation beam; a support constructed to hold a patterning device being capable of imparting the radiation beam with a pattern in its cross-section; and a projection system configured to project the patterned radiation onto a target portion of the substrate; and an inspection apparatus configured to measure a property of the substrate including: a base frame; a substrate table configured to hold the substrate; an illumination system arranged to direct a beam of radiation onto the substrate; at least one sensor arrangement constructed and arranged to detect radiation reflected off the substrate; and a balanced positioner configured to displace one of the substrate table and sensor arrangement in at least one direction, the balanced positioning system including: at least one balance mass; a bearing configured to movably support the balance mass; a track arrangement effective to guide the displacement in the one direction; and a motor arrangement configured to cause the displacement in the one direction; wherein the balance mass is positioned relative to the track arrangement such that the centers of gravity of the balance mass and the one of the substrate table and sensor arrangement are substantially aligned in the direction substantially perpendicular to the plane including the direction of displacement.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
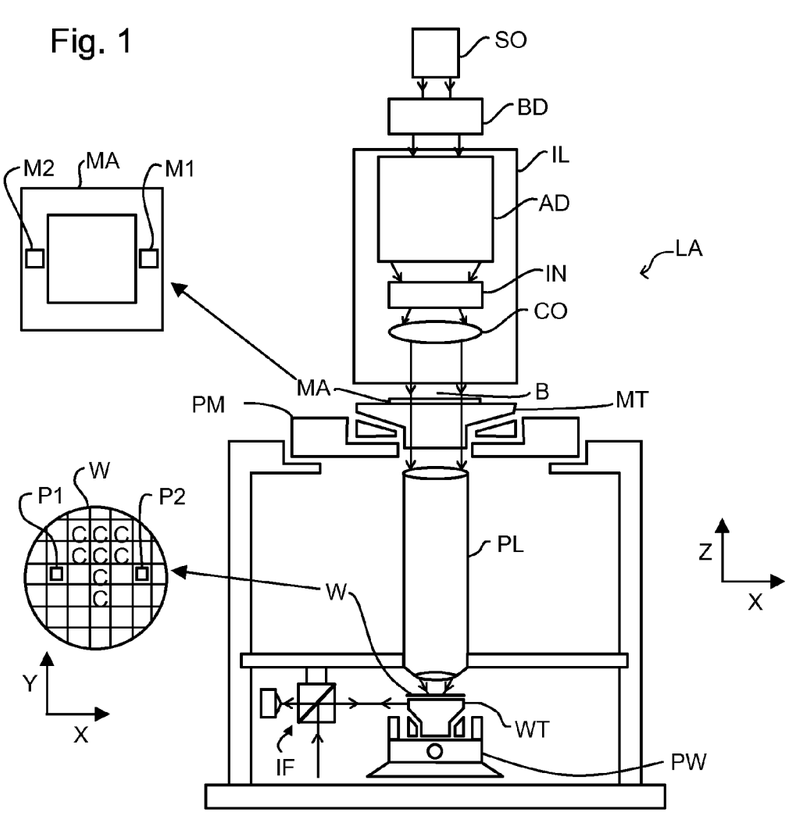
FIG. 1 depicts a lithographic apparatus in accordance with an embodiment of the invention.

FIG. 1 schematically depicts a lithographic apparatus. The apparatus includes: an illumination system (illuminator) IL configured to condition a radiation beam B (e.g. UV radiation or DUV radiation); a patterning device support or support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions.

The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support (e.g. mask table) MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
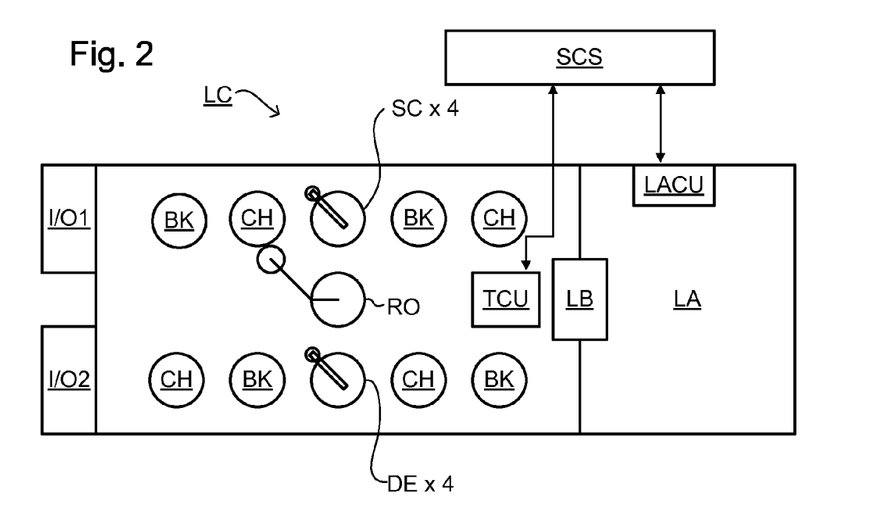
FIG. 2 depicts a lithographic cell or cluster in accordance with an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
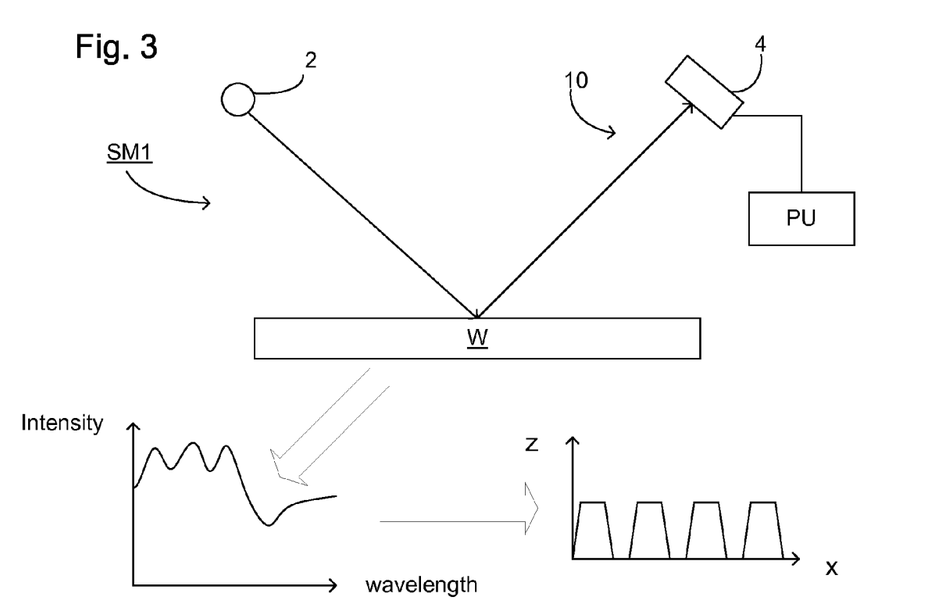
FIG. 3 depicts a scatterometer in accordance with an embodiment of the invention.

FIG. 3 depicts a scatterometer SM1 which may be used in an embodiment of the present invention. It includes a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
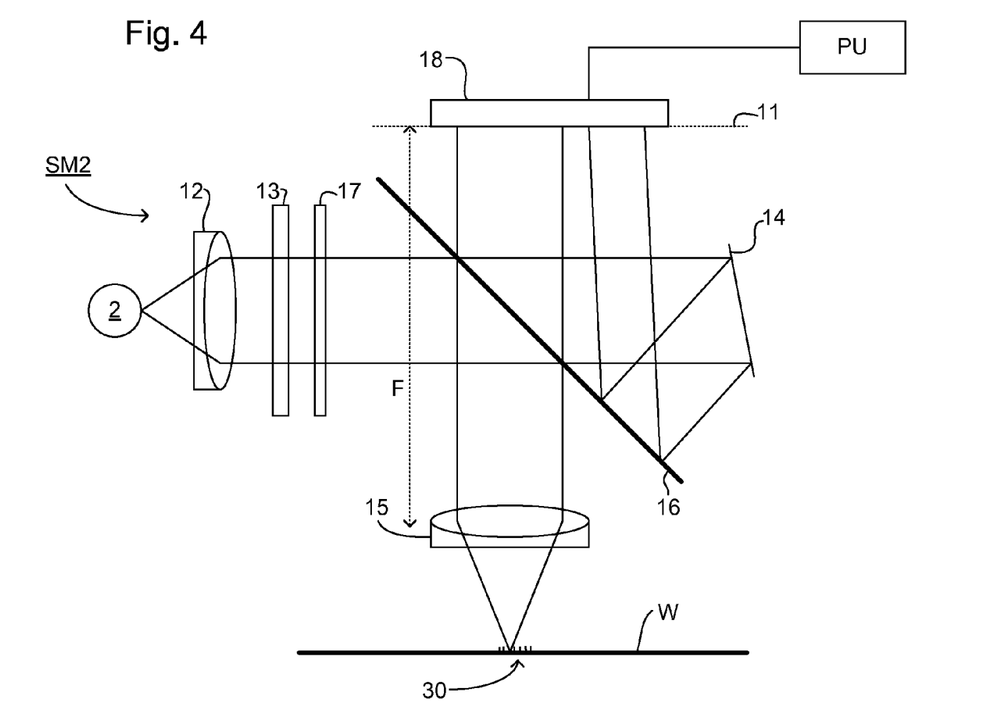
FIG. 4 depicts a scatterometer in accordance with an embodiment of the invention.

Another scatterometer SM2 that may be used with an embodiment of the present invention is shown in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, 405-790 nm or even lower, such as 200-300 nm. The interference filter may be tunable rather than including a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband radiation source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\delta\lambda$ and a spacing of at least 2 $\delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A.

The target 30 on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

Figure 5:
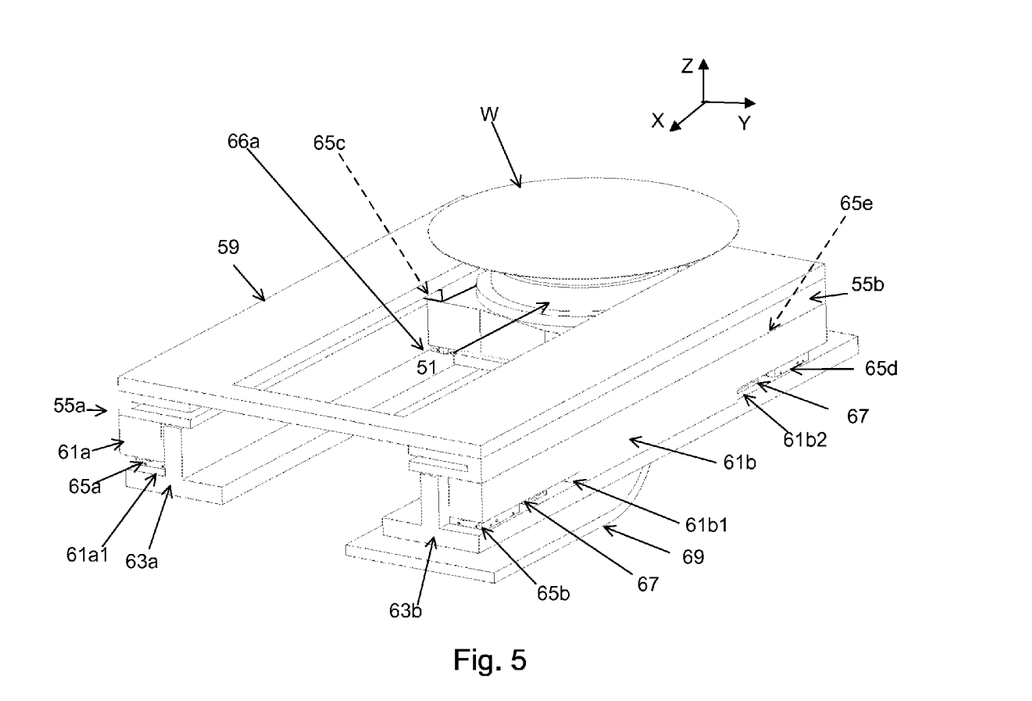
FIG. 5 depicts a balanced positioner in accordance with an embodiment of the invention for positioning a wafer carrier in a substrate stage.
Figure 6:
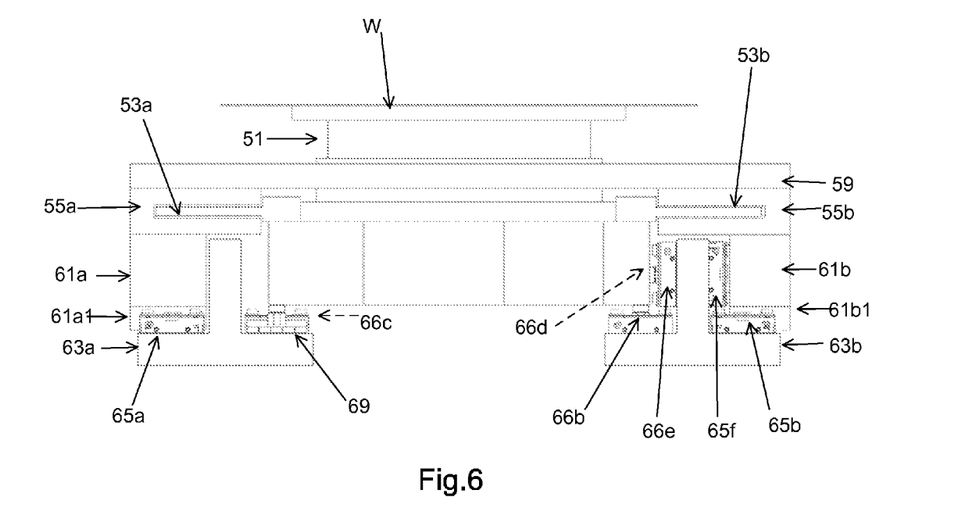
FIG. 6 depicts a view in the Y-Z plane at the centre of the balanced positioner of FIG. 5.

Referring now to FIGS. 5 and 6, these figures depict a balanced positioning system or balanced positioner configured to position a substrate carrier in a substrate stage in an inspection apparatus in accordance with an embodiment of the invention. The substrate W is carried on a substrate carrier 51 which is movable in the X direction using two linear motors, the movement being balanced by a balance mass which encloses the magnet tracks of the two linear motors as will now be described in more detail.

Each linear motor includes a linear motor coil 53a, 53b which is moveable along a respective magnet track 55a, 55b. The magnet tracks 55a, 55b are enclosed by a balance mass formed of upper and lower heavy steel parts 59, 61a, 61b. The upper part 59 is rectangular in plan view, with an aperture to accommodate the substrate carrier including motor coils 53a and 53b. The lower part of the balance mass includes two bars 61a, 61b carried at either side of the substrate carrier 51, with recesses 61a1, 61a2, 61b1, 61b2 at each end of their lower surfaces.

The balance mass 59, 61a, 61b and substrate carrier 51 are supported by substantially frictionless bearings so as to be movable over guide surfaces provided on two "T" shaped guide tracks 63a, 63b fastened to the machine base frame (not shown), the outer most surfaces of the tracks fitting round the lower and inner surfaces of the bars 61a, 61b. In this particular embodiment, the frictionless bearings are air-bearing pads, which are preloaded by weight and/or by magnetic forces provided by magnet pads provided in respect of each air-bearing pad. It will be appreciated however, that other forms of bearings such as vacuum preloaded air bearings may be used. In this particular embodiment, the balance mass 59, 61a, 61b is supported by four horizontal air-bearing pads, 65a,b,c,d and two vertical air-bearing pads 65e,f, of which only three horizontal air-bearing pads 65a,b,d and one vertical air-bearing pad 65f are visible in the figures. The substrate carrier 51 is supported by three horizontal air bearing pads, 66a,b,c and two vertical air-bearing pads 66d,e of which only two horizontal pads 66a, 66b and one vertical pad 66e are visible in the figures. An appropriate number of magnet pads 69 are provided to provide the required magnetic preload force for each air-bearing pad, only one such magnet pad 69 being visible in the figures. It will be appreciated that in alternative designs, different numbers of bearings may be used, in particular the number of bearings in the Z direction in order to avoid over determination of the degrees of freedom.

Two of the balance mass horizontal air-bearing pads 65a,b bear on horizontal surfaces of the "T" shaped guide tracks 63a, 63b underneath the balance mass 59,61, with corresponding magnet pads 67 spaced from each air pad in X-direction providing the desired magnetic preload force, only two of the magnet pads 67 being visible in the figures. These locate in the recesses 61a1, 61b1 underneath the balance mass bars 61a, 61b. Two further horizontal air bearing pads 65c, 65d bear on further surfaces of the "T" shaped guide tracks 63a, 63b together with corresponding magnet pads 67 so as to be located in the recesses 61a2, 61b2 underneath the balance mass bars 61a, 61b These four bearings provide the Z bearing and the rotational Rx and Ry bearings for the balanced positioning system.

The two vertical air bearing pads 65e, 65f and corresponding magnet pads (not visible in the figures) are mounted on the one of the vertical surfaces of the "T" beam guide track 63b, so as to locate a vertical surface of the balance mass bar 61b. These provide the Y and Rz bearings of the balance mass. In use of the system, when the air supply is switched on, there will be a clearance between the air bearing and the guide tracks 63a, 63b as well as between the magnet pads and the guide tracks.

The horizontal air bearing pads 66a,b,c similarly bear on further horizontal surfaces of the guide tracks 63a, 63b, with the vertical air bearing pads 66d,e bearing on the opposite vertical surface of the guide track 63b.

The air bearing pads 65a,b,c,d,e,f and 66a,b,c,d,e are made of ground or lapped aluminum, with an opalized coating. The magnet pads 67, 69 are made of ground metal ferromagnetic strips with permanent magnets adhered to them. The "T" beam guide tracks 63a, 63b will also be made of a ferromagnetic material so as to act on the air bearing pads so as to create a pre-load force between the magnet pads and the guide tracks 63a, 63b. The gap between the magnets on the magnet pads 67, 69 and the guide tracks 63a, 63b is adjustable during assembly so that the pre-load can be fine-tuned. Furthermore, the guide tracks 63a, 63b are coated with a ground chromium plating on the bearing surfaces, which promote a good smooth, flat and robust air bearing running surface. The remaining surfaces of the guide tracks is nickel plated. The air bearings may alternatively be made of other materials which are non-magnetic and have a surface hard enough to glide over the guide tracks without being damaged. Examples of suitable materials include hard anodized aluminum which has been ground after treatment and ceramic materials and Porous Media Technology like porous carbon for example It will be appreciated that as the balance mass 59, 61a, 61b is stacked round the magnet tracks a particularly compact arrangement is achieved without increasing the footprint of the apparatus. Furthermore, the arrangement shown in FIGS. 5 and 6 is an open structure in which an optical path can pass from the radiation source 2 to the top of the substrate W. This is also the case in the embodiment described in relation to FIGS. 11 to 13 as will be described later.

If the substrate carrier 51 is moving in the +X direction the reaction force of the linear motors will react on the balance mass. The balance mass will therefore move in the −X direction. If, for example, the ratio of the mass of the balance mass to the substrate carrier is 10:1, the displacement of the balance mass will be ten times less than the displacement of the substrate carrier. The ratio will vary on the construction, a typical value being 6:1. The value of the mass of the balance mass will be determined statically, or by dynamic testing.

Figure 7:
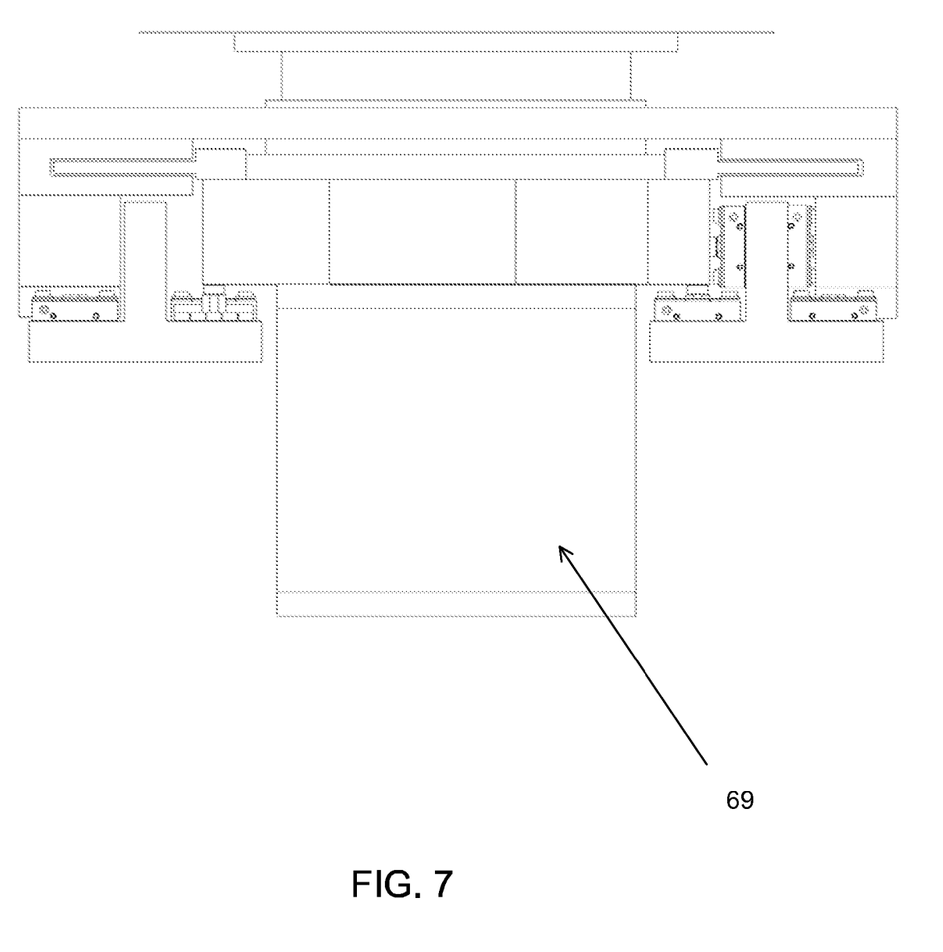
FIG. 7 depicts a variation of the balanced positioner of FIGS. 5 and 6.

A cable slab, shown as 69 in FIG. 5 may be provided under the guide track 63a,b to guide cables for electrical signals, cooling water, pressurized air and vacuum. As is shown in FIG. 7, alternatively or additionally a cable slab 69 may also be provided under the substrate carrier 51. It will be appreciated that the cable slab arrangements shown in FIGS. 5 and 7 have the particular merit that any contamination from the cables will be generated under the level of the wafer and the down flow particles will not land on the wafer surface. This configuration is also the best option considering the lifetime of the cable slab and its dynamical behavior.

It will be appreciated that it is a particular benefit of a balanced positioner in accordance with an embodiment of the invention, that the center of gravity of the balance mass and the wafer carrier 51 may be matched. In the event that the center of gravity does not exactly match in the lateral plane, that is the XY plane, the induced torques in the $R_z$ direction of both the carrier 51 and the balance mass will act on the one single T-shaped guide track 63b. By matching the centers of gravity on the Z direction, minimizes the Ry torque on the guide tracks 63a, 63b so both the $R_y$ and $R_z$ torques are minimized.

It will be appreciated that the substrate carrier is equipped with five guiding surfaces to block all other directions than the directions of movement. Temperature effects may result in linear expansion of the carrier and thus may not create distortions. It will also be appreciated that in the particular configuration shown spare parts can be easily reached.

Figure 8:
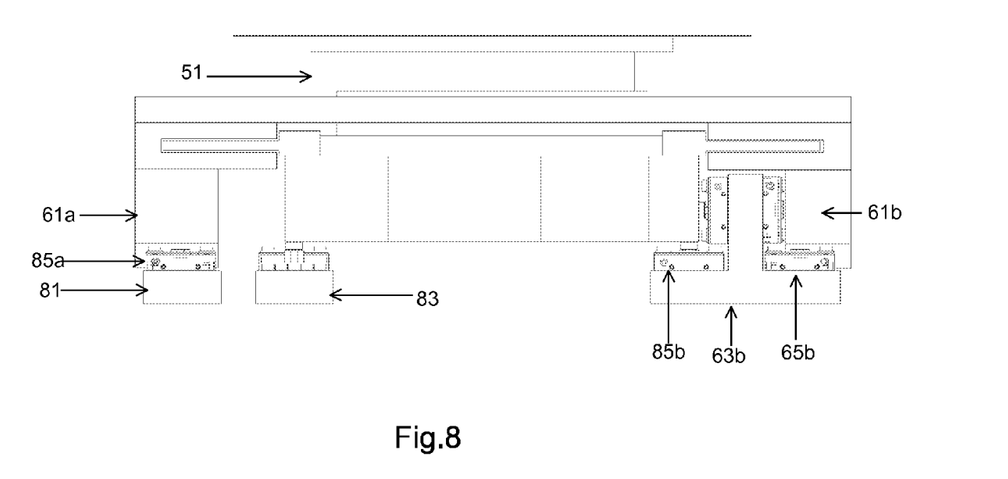
FIG. 8 depicts a view of a balanced positioner in accordance with variation of the embodiment of the invention of FIG. 5.
Figure 9:
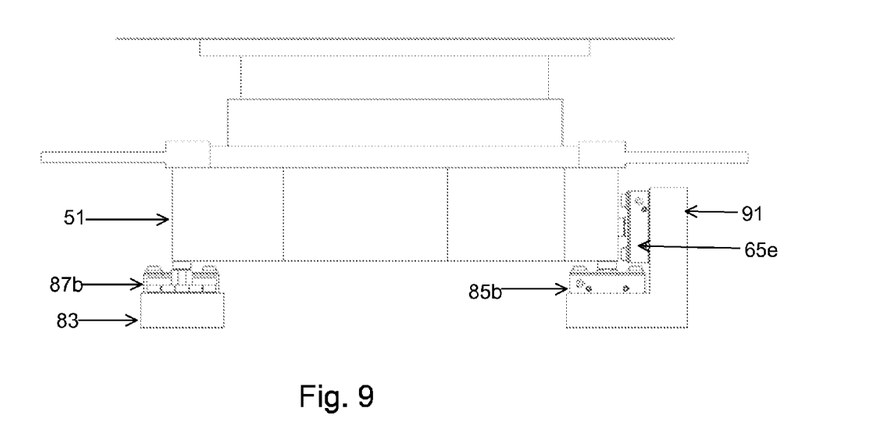
FIG. 9 depicts the substrate carrier and guiding surfaces incorporated in a further variation of the balanced positioner of the embodiment of FIG. 5.
Figure 10:
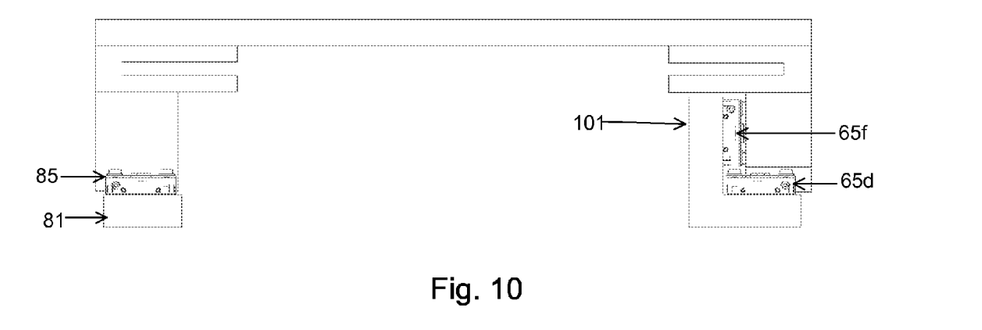
FIG. 10 depicts the balance mass and guiding surfaces incorporated in a further variation of the balanced positioner of FIG. 9.

Turning now to FIGS. 8, 9 and 10 it will be appreciated the use of the two T-shaped guide tracks 63a, 63b has the particular benefit of increasing vertical bending stiffness. However, in the arrangement shown in FIG. 8, two separate blocks 81, 83, as shown in FIG. 5, may replace the left-hand guiding surface 63a. The block 81 has a guiding surface, which supports an air-bearing pad 85, and corresponding magnetic pad (not seen), carried by the undersurface of the balance mass bar 61a. The block 83 supports an air bearing (not shown) and corresponding magnetic pad, carried by the underside of the substrate carrier 51.

Referring now to FIGS. 9 and 10, in a further embodiment of the invention, the right-hand T shaped guiding surface 63b as shown in FIG. 5, may be replaced by two oppositely directed L shaped guiding surfaces, one 91 of which supports horizontal and vertical bearings carried by the wafer carrier 51, as shown in FIG. 9. The other guiding surface 101 supports horizontal and vertical bearings, carried by the balance mass part 61b.

Figure 11:
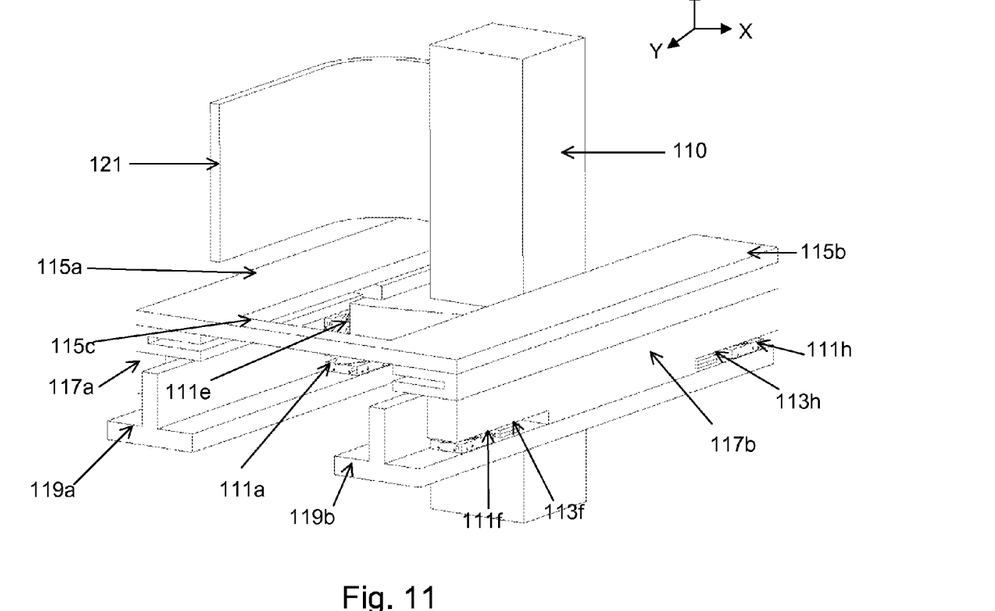
FIGS. 11 and 12 are views of a balanced positioner in accordance with an embodiment of the invention, for positioning a sensor in a sensor stage.
Figure 12:
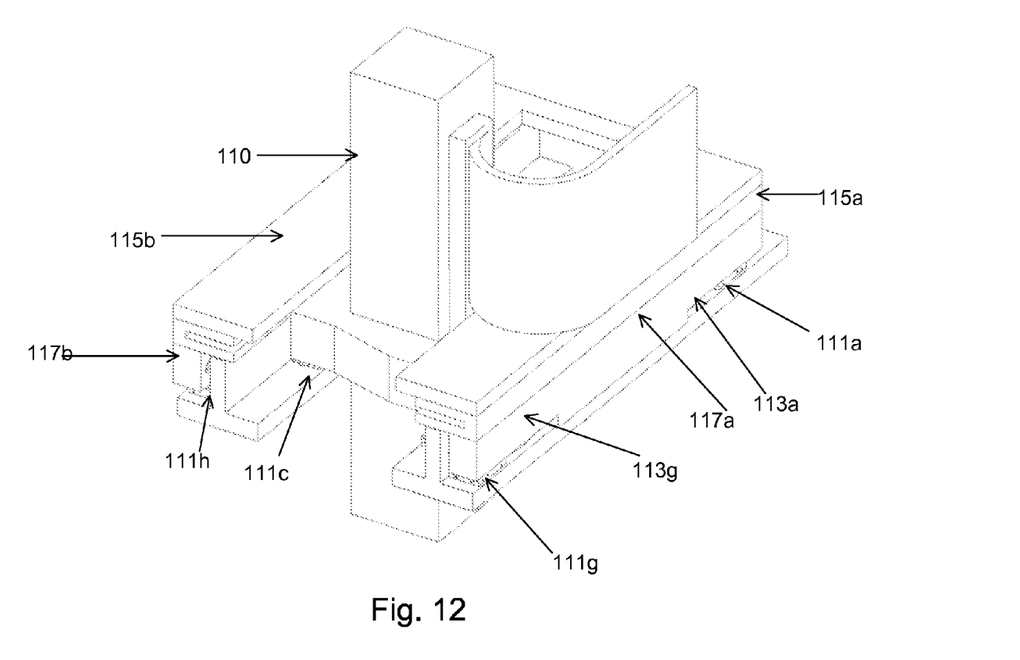
Figure 13:
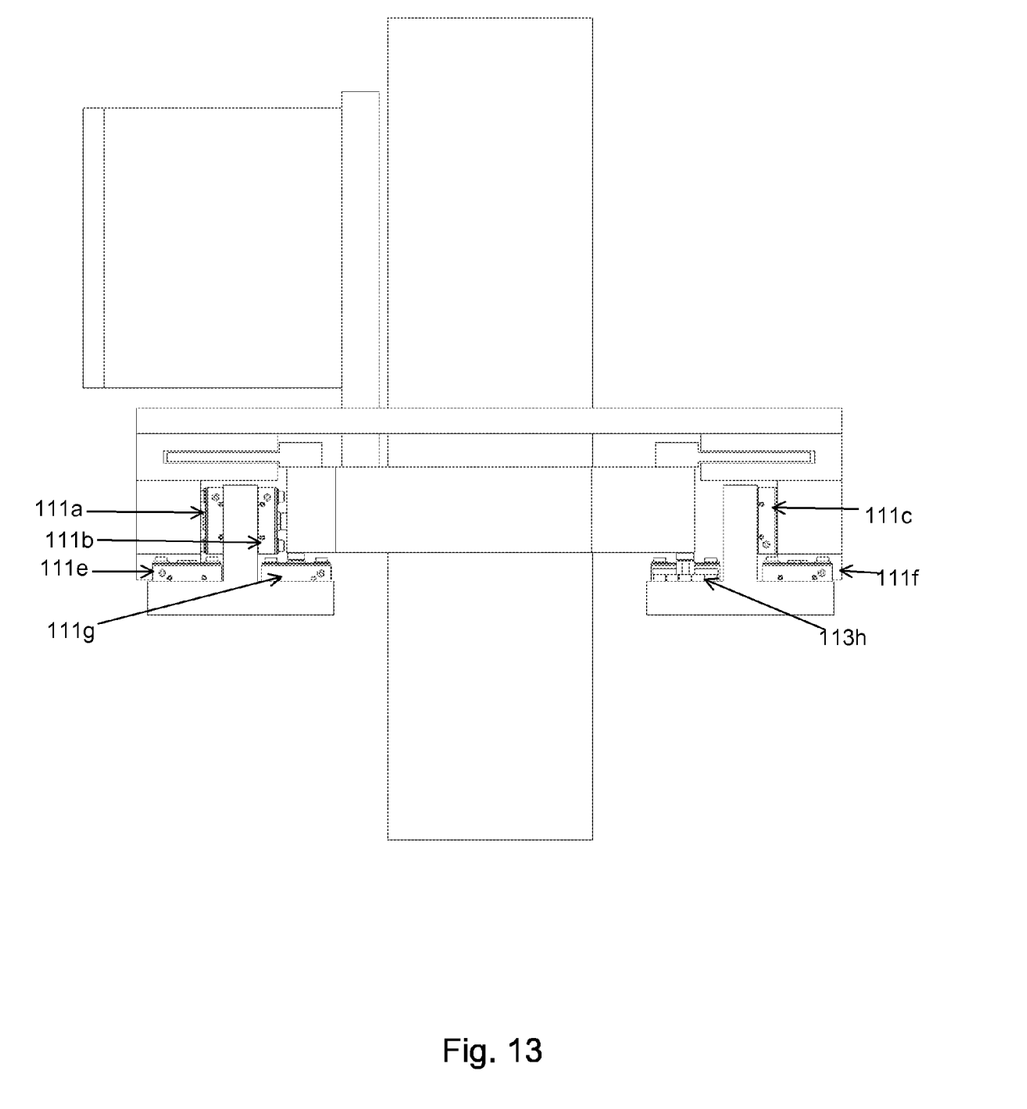
FIG. 13 is a view in the Y-Z plane at the centre of the balanced positioner of FIG. 11.

Turning now to FIGS. 11, 12 and 13 the same principles as those applied in the embodiment of FIG. 5 may be applied to a balanced positioner for the sensor stage, in that the balanced mass is positioned around the magnet tracks of the linear motor such that the balance mass and the sensor shape have substantially the same centre of gravity. However, the balanced positioner for the sensor stage is rotated through 90°, relative to the balanced mass positioning system provided for the wafer stage The sensor stage is supported by in total three vertical air bearings 111a,b,c and two horizontal air bearings 111d,e. The upper part of the balance mass is of a generally "U" shaped heavy steel mass, with the left and right sides 115a, 115b being connected together at one end only by a cross beam 115c that is arranged to be flexible in several directions so as to enable to sensor stage to be moveable in the region between the right and left sides 115a,115b, that is moveable in the Y-direction. The lower part of the balance mass includes two heavy steel bars 117a, 117b, with cutouts at each end in which the bearing arrangement is located as in the first embodiment. The bars 117a, 117b are moveably supported by the bearings acting on two T beams 119a, 119b as in the first embodiment. Thus the two parts of the balance mass 115,117 are only rigid in the direction substantially parallel to the direction of movement.

The bars 117a, 117b are moveably supported by the bearings acting on two T beams 119a, 119b as in the embodiment of FIG. 5. The operation of the balance mass for this embodiment is substantially similar to that of the embodiment of FIG. 5.

As in the first and second embodiments, as shown in FIGS. 11,12 and 13, an appropriate cable slab 121 can be carried by the sensor stage 110, although this cable slab will not have the benefit of the cable slab for the substrate stage, in being mountable below the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An inspection apparatus configured to measure a property of a substrate, the apparatus comprising:
 a base frame;
 a substrate table configured to support the substrate;
 an illumination system configured to direct a beam of radiation onto the substrate;
 a sensor configured to detect radiation reflected off the substrate; and
 a balanced positioner configured to:
  surround an optical path of the beam of radiation, and
  displace one of the substrate table and the sensor in at least one direction, wherein the balanced positioner comprises:

a balance mass comprising a first part and a second part;

a bearing configured to movably support the balance mass;

a guide track configured to guide the displacement in the one direction; and a motor comprising a track configured to cause the displacement in the one direction, the track being stacked between the first and second parts to achieve a compact arrangement of the balance mass and the motor.

2. The apparatus according to claim 1, wherein the motor is a linear motor, the linear motor comprising coils that are carried by one of the substrate table and the sensor.

3. The apparatus according to claim 1, wherein the bearing comprises air bearings preloaded by weight, magnetic forces, or vacuum forces.

4. The apparatus according to claim 1, wherein the bearing is positioned between the balance mass and a first guiding surface to allow the displacement in the one direction.

5. The apparatus according to claim 4, further comprising:

an additional bearing provided between one of the substrate table and the sensor; and an additional guiding surface to enable displacement of one of the substrate table and the sensor in a direction different from the one direction.

6. The apparatus according to claim 5, wherein the guiding surface and the additional guiding surface are formed on different surfaces of the guide track, the guide track comprising a T beam shape.

7. The apparatus according to claim 1, wherein the track is supported by the guide track.

8. The apparatus according to claim 1, wherein:

the bearing comprises magnetically biased air bearings; and the guide track comprises a ferromagnetic material.

9. The apparatus according to claim 1, further comprising a cable slab mounted to the balanced positioner and one of the substrate table and the sensor.

10. The apparatus according to claim 9, wherein:

the cable slab is mounted to one of the balanced positioner and the substrate table; and the cable slab is positioned under the level of the substrate table.

11. The apparatus according to claim 1, wherein the balance mass is positioned relative to the guide track such that centers of gravity of the balance mass and one of the substrate table and the sensor are substantially aligned.

12. A method of measuring a property of a substrate, the method comprising:

directing a beam of radiation onto the substrate, the substrate being supported on a substrate table;

detecting, using a sensor, radiation reflected off the substrate; and displacing, using a balanced positioner surrounding an optical path of the beam of radiation, one of the substrate table and the sensor in at least one direction, the displacing comprising:

moving, using a motor, one of the substrate table and the sensor, the comprising a track;

balancing, using a balance mass, the movement of one of the substrate table and the sensor, the balance mass comprising a first part and a second part, wherein the track is stacked between the first and second parts to achieve a compact arrangement of the balance mass and the motor;

supporting movably, using a bearing, the balance mass;

guiding, using a guide track, the displacement in the one direction; and positioning the balance mass relative to the guide track such that centers of gravity of the balance mass and one of the substrate table and the sensor are substantially aligned in a direction substantially perpendicular to a plane including the direction of displacement.

13. A lithographic system comprising:

a lithographic apparatus, comprising:

a support configured to hold a patterning device, the patterning device being capable of imparting a radiation beam with a pattern in its cross-section to form a patterned radiation beam;

a projection system configured to project the patterned radiation beam onto a target portion of a substrate; and an inspection apparatus configured to measure a property of the substrate, the inspection apparatus comprising:

a base frame;

a substrate table configured to hold the substrate;

an illumination system configured to direct a beam of radiation onto the substrate;

a sensor configured to detect radiation reflected off the substrate; and a balanced positioner configured to:

surround an optical path of the beam of radiation, and displace one of the substrate table and the sensor in at least one direction, wherein the balanced positioner comprises:

a balance mass comprising a first part and a second part;

a bearing configured to movably support the balance mass;

a guide track configured to guide the displacement in the one direction; and a motor comprising a track configured to cause the displacement in the one direction, the track being stacked between the first and second parts to achieve a compact arrangement of the balance mass and the motor.

14. The system according to claim 13, wherein the balance mass is positioned relative to the guide track such that centers of gravity of the balance mass and one of the substrate table and the sensor are substantially aligned in a direction substantially perpendicular to a plane including the direction of displacement.

* * * * *

UNITED STATES PATENT AND TRADEMARK OFFICE
CERTIFICATE OF CORRECTION

PATENT NO. : 8,773,640 B2  
APPLICATION NO. : 12/993463  
DATED : July 8, 2014  
INVENTOR(S) : Seijger et al.

Page 1 of 1

It is certified that error appears in the above-identified patent and that said Letters Patent is hereby corrected as shown below:

In the Claims

In column 14, claim 12, line 2, after "the" please insert --motor--.

Signed and Sealed this
Twentieth Day of January, 2015

Michelle K. Lee
*Deputy Director of the United States Patent and Trademark Office*